(12) United States Patent  
Yoshida et al.

(10) Patent No.: US 8,319,936 B2  
(45) Date of Patent: Nov. 27, 2012

(54) DISPLAY DEVICE WITH COOLING CONTROL

(75) Inventors: Tomonori Yoshida, Osaka (JP);  
Hidenori Sato, Osaka (JP); Hiroyuki Uchida, Osaka (JP); Shohei Takahashi, Osaka (JP); Ryuji Fukagawa, Osaka (JP)

(73) Assignee: Sanyo Electric Co., Ltd., Moriguchi-shi (JP)

( * ) Notice: Subject to any disclaimer, the term of this patent is extended or adjusted under 35 U.S.C. 154(b) by 432 days.

(21) Appl. No.: 12/689,543

(22) Filed: Jan. 19, 2010

(65) Prior Publication Data

US 2010/0182562 A1 Jul. 22, 2010

(30) Foreign Application Priority Data

Jan. 19, 2009 (JP) ................................. 2009-008757

(51) Int. Cl.
  *G02F 1/1333* (2006.01)
  *G09G 3/36* (2006.01)
(52) U.S. Cl. ............................ 349/161; 349/72; 345/101

(58) Field of Classification Search ................... 349/161, 349/72; 345/101  
See application file for complete search history.

(56) References Cited

U.S. PATENT DOCUMENTS 7,161,803 B1 * 1/2007 Heady ........................... 361/700  
2007/0115686 A1 * 5/2007 Tyberghien ................... 362/580

FOREIGN PATENT DOCUMENTS

| JP | 08316676 A | 11/1996 |
| JP | 09307257 | 11/1997 |
| JP | 2001345590 A | 12/2001 |
| JP | 2005286987 | 10/2005 |

OTHER PUBLICATIONS

Japanese Office Action issued on Nov. 2, 2010 in the corresponding to Japanese Patent Application No. 2009-008757.

* cited by examiner

*Primary Examiner* — Michael Caley  
(74) *Attorney, Agent, or Firm* — NDQ&M Watchstone LLP (57) ABSTRACT

A display device comprises a display panel, a cooling unit cooling air in a casing containing the display panel, a fan unit generating an air flow in the casing, and a control unit controlling the cooling unit and the fan unit, and when the control unit deactivates the cooling unit, the control unit also deactivates the fan unit.

4 Claims, 10 Drawing Sheets

DISPLAY DEVICE WITH COOLING CONTROL

This application which claims priority under 35 U.S.C. §119 from the Japanese patent application Number 2009-008757 is incorporated by reference herein.

BACKGROUND OF THE INVENTION

1. Field of the Invention

The present invention relates to a display device which can be installed outdoors.

2. Description of Related Art

Conventionally, flat type displays such as a liquid crystal display are widely used. Most of the conventional flat type displays are designed for indoor installations, and the measures to protect them from the environmental condition such as a rainstorm, dust etc. are not taken. Therefore, when displays are permanently installed outdoors, and a trouble may occur in the display panel or the circuit board because the panel or the circuit board is disposed to rainstorm etc.

In view of this, it was considered to arrange the display panel and the circuit board in a sealed casing in order to protect them.

However, when the display panel and the circuit board are arranged in a sealed casing, heat generated from the display panel or the circuit board stays inside the casing, and the temperature in the casing increases. Accordingly a trouble may possibly occur in the display panel or the circuit board.

Further, when these displays are installed outdoors, a temperature of the image display screen of the display panel increases because of the sunlight. As a result, a trouble may occur in the display panel, for example, a "blackout". The blackout is a phenomenon in which the liquid crystal panel cannot display an image when a liquid crystal in the liquid crystal panel loses its orientation due to the temperature increase.

In view of this, it was considered to provide a cooler for cooling the air inside the casing and a fan for circulating the cooled air, and flow the air cooled by the cooler into a gap between the image display screen of the display panel and the glass plate provided to the casing.

On the other hand, when the temperature of the image display screen falls, it is considered to stop the cooling of the air by the cooler.

However, if only the cooler is deactivated while keeping the fan activated, the air is warmed by the heat generated from the display panel or the circuit board, and the warmed air is flown between the image display screen and the glass plate. Therefore, moisture in the air is precipitated due to a temperature difference between the cooled glass plate and the warmed air. As a result, dew condensation occurs on a rear surface of the glass plate, and a viewability of the image display screen of the display panel is deteriorated.

SUMMARY OF THE INVENTION

A display device of the present invention comprises a display panel, a cooling unit cooling air in a casing containing the display panel, a fan unit generating an air flow in the casing, and a control unit controlling the cooling unit and the fan unit, and when the control unit deactivates the cooling unit, the control unit also deactivates the fan unit.

DETAILED DESCRIPTION OF THE PREFERRED EMBODIMENT

Preferred embodiments of the present invention are described in detail below with reference to the drawings.

1. First Embodiment (The Structure of the Display Device)

Figure 1:
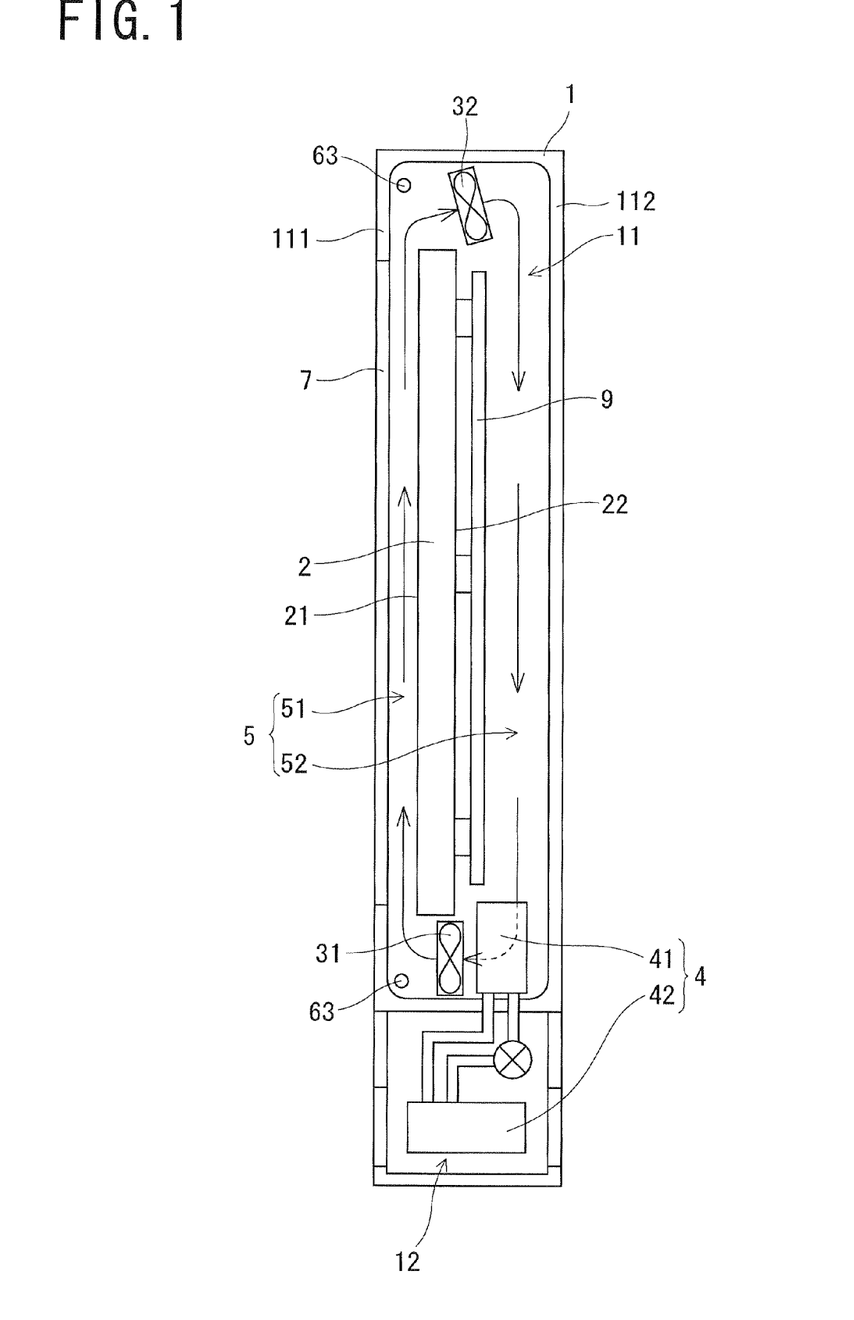
FIG. 1 is a vertical cross sectional view of a display device according to a first embodiment of the present invention.

As shown in FIG. 1, a display device according to a first embodiment of the present invention comprises a casing 1 having a waterproof structure. Inside the casing 1, defined are an accommodation room 11, and a second accommodation room 12 which is under the accommodation room 11.

Inside the accommodation room 11, provided are a liquid crystal display panel 2 comprising an image display screen 21, and a circuit board 9 for controlling the display device. The liquid crystal display panel 2 is arranged with the image display screen 21 thereof facing a front surface side of the casing 1, while the circuit board 9 is arranged on a rear surface 22 of the liquid crystal display panel 2.

The accommodation room 11 includes a front surface wall 111 a part of which is formed by a glass plate 7. The glass plate 7 faces the image display screen. It is thereby possible to view the image display screen 21 from the front surface side of the casing 1.

Additionally, inside the accommodation room 11, defined is a circulation flow passage 5 surrounding the liquid crystal display panel 2, and provided are air blowing fans 31, 32 for circulating air in the circulation flow passage 5 and an air temperature sensor 63 for measuring a temperature of the air in the circulation flow passage 5.

The circulation flow passage 5 includes a front surface side flow passage part 51 sandwiched by the image display screen 21 and the front surface wall 111, and a rear surface side flow passage part 52 extending along the rear surface 22 of the liquid crystal display panel 2. Top ends of the passage parts 51 and 52 communicates each other via a space above the liquid crystal display panel 2, while bottom ends of the passage parts 51 and 52 are communicates each other via a space below the liquid crystal display panel 2.

The air blowing fans 31, 32 generate an air flow in the circulation flow passage 5. Specifically they make the air pass through the passage parts 51 and 52 so that the air in the circulation flow passage 5 circulates.

In the display device, the air blowing fan 31 is arranged below the liquid crystal display panel 2, while the air blowing fan 32 is arranged above the panel 2. The air blowing fan 31 makes the air below the panel 2 flow from the passage part 52 toward the passage part 51, while the air blowing fan 32 makes the air above the panel 2 flow from the passage part 51 toward the passage part 52, as indicated by arrows in FIG. 1.

Therefore, the air blowing fans 31, 32 make air flow from bottom up in the front side, and make air flow from top down in the rear side.

Figure 2:
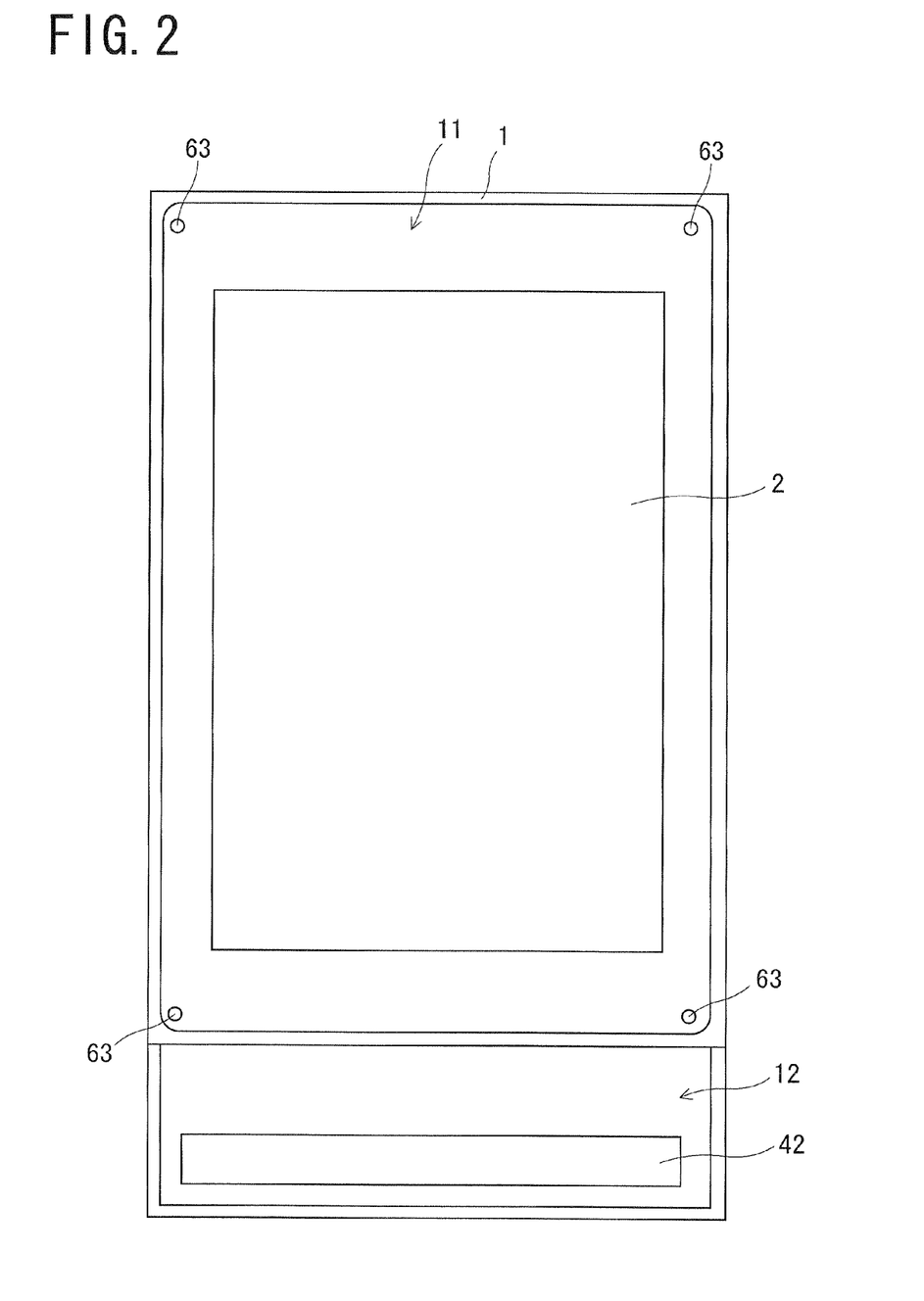
FIG. 2 is a cross sectional view showing arrangement of air temperature sensors provided to the display device.

The air temperature sensor 63 is arranged adjacent to a rear surface of the front surface wall 111 of the accommodation room 11 as shown in FIG. 1, and is arranged at each of four corners of the accommodation room 11 as shown in FIG. 2. The air temperature sensor 63 may be arranged at any position (i.e. the upper side, lower side, left side, or the right side of the liquid crystal display panel 2). Also, two or more air temperature sensors 63 may be arranged.

An evaporator 41 is provided inside the accommodation room 11, while a condenser 42 is provided inside the accommodation room 12. The evaporator 41 and the condenser 42 form a cooling device 4 cooling the air in the accommodation room 11.

By operating the cooling device 4, heat is collected from the air in the accommodation room 11 by the evaporator 41, and the heat collected by the evaporator 41 is discharged to the outside of the accommodation room 11 by the condenser 42. Thereby the air in the accommodation room 11, in particular, the air in the circulation flow passage 5 is cooled.

According to the display device described above, since the liquid crystal display panel 2 and the circuit board 9 are provided in the accommodation room 11 defined inside the casing 1 having the waterproofing structure, it can protect the panel 2 and the circuit board 9 from the rainstorms or dusts, and enables the display device to be installed outdoors.

(Controls Executed in Display Device)

Figure 3:
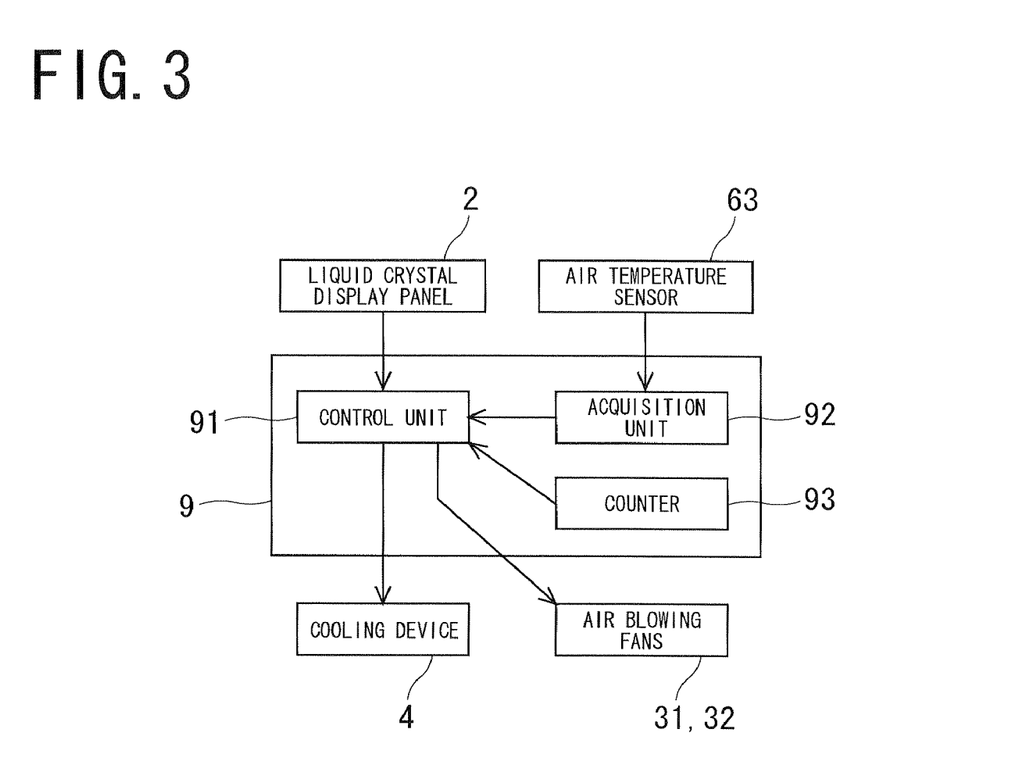
FIG. 3 is a block diagram showing a configuration of the display device.

FIG. 3 is a block diagram showing the configuration of the display device described above. As shown in FIG. 3, the circuit board 9 comprises: a control unit 91 for controlling the liquid crystal display panel 2, the air blowing fans 31, 32, and the cooling device 4; an acquisition unit 92 for acquiring the temperature measured by the air temperature sensor 63; and a counter 93 for measuring time. The circuit board 9 controls the cooling device 4 and the air blowing fans 31, 32 in accordance with a flow chart shown in FIG. 4.

When the operation of the display device described above is started, the liquid crystal display panel 2 is activated by the control unit 91, and thus heat is generated from the panel 2. By this heat, the temperature of the panel 2 is increased and thus the temperature of the air in the circulation flow passage 5 is increased. If the sun light enters the image display screen 21 the temperature of the screen 21 is increased and thus the temperature of the air in the passage 5, especially the front surface side flow passage part 51 is increased.

At the time the operation of the display device starts, the air blowing fans 31, 32 and the cooling device 4 are in a deactivated state. However, if both the air blowing fans 31, 32 and the cooling device 4 are kept deactivated, the temperature of the panel 2 or the circuit board 9 is increased excessively by the heat from the panel 2 or from the sun, whereby a trouble may occur in the panel 2 or the circuit board 9.

Figure 4:
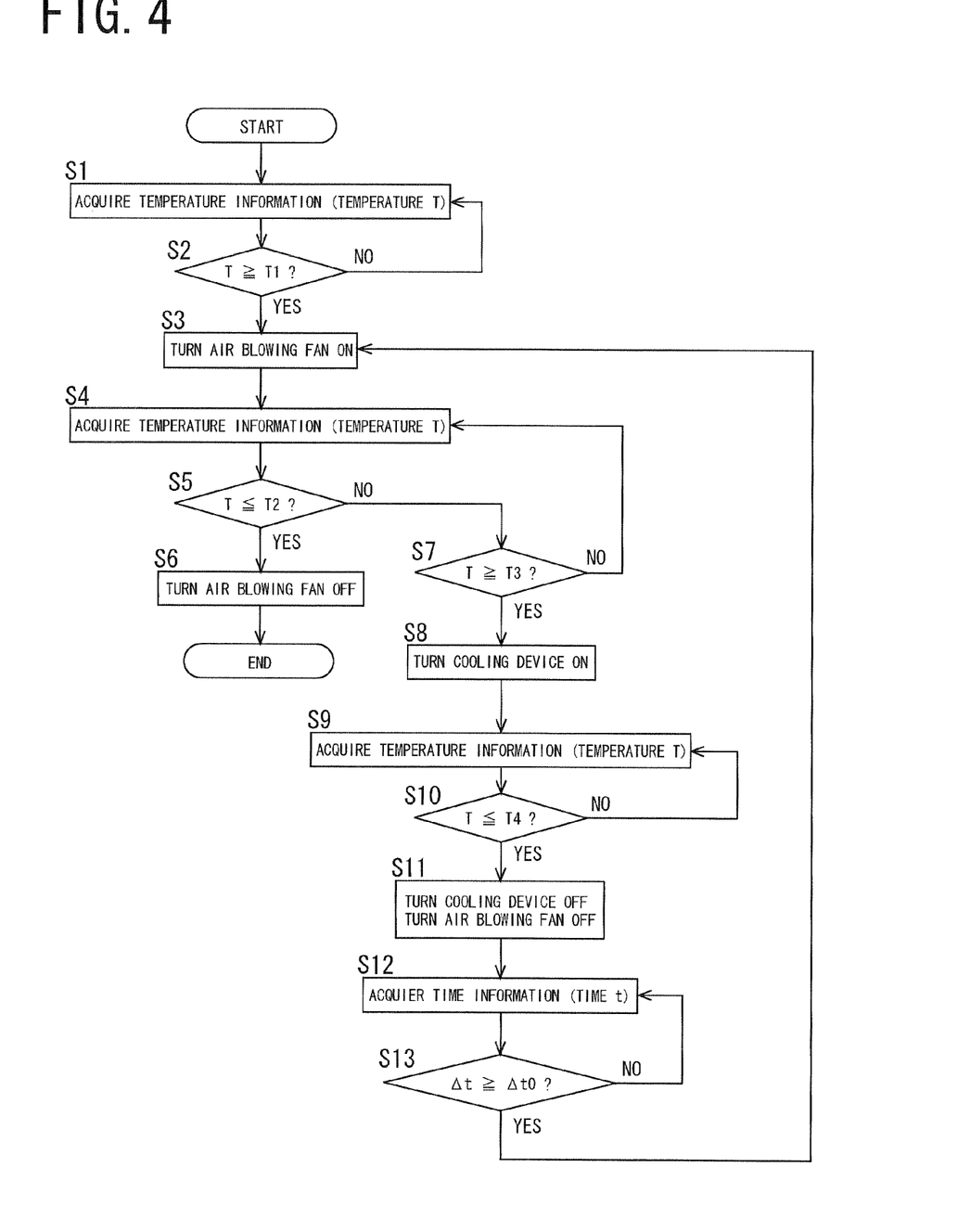
FIG. 4 is a flow chart showing a flow of control of the display device.

Thus, first in step S1, the acquisition unit 92 acquires the temperature T of the air in the circulation flow passage 5 measured by the air temperature sensor 63 as temperature information.

Then, in step S2, the control unit 91 determines whether or not the temperature T acquired in step S1 is equal to or higher than a first preset temperature T1. Here, T1 is a temperature at which the control unit 91 should activates the air blowing fans 31, 32 so that an increase in the temperature T becomes gradual after the operation of the display device starts.

In this embodiment, since four air temperature sensors 63 are provided as shown in FIG. 2, acquisition unit 92 acquires temperature from each of the sensors 63 in step S1, and therefore, an average value acquired from these sensors may be used in the determination by the control unit 91 in the step S2. The same can be applied to steps S5 and S10 to be described below.

If the control unit 91 determines that the temperature T is neither equal to nor higher than the first preset temperature T1 (NO in step S2), it returns to step S1, and the acquisition unit 92 acquires the temperature information (temperature T) from the air temperature sensor 63 again. Then, steps S1 and S2 are repeatedly executed until the control unit 91 determines in step S2 that the temperature T acquired in step S1 is equal to or higher than T1.

If the control unit 91 determines that the temperature T is equal to or higher than T1 (YES in step S2), the control unit 91 controls the air blowing fans 31, 32 to be turned ON in step S3. At this time, the control unit 91 controls the cooling device 4 to be kept OFF.

By operating the air blowing fans 31, 32, the air in the circulation flow passage 5 is circulated, and therefore, the heat from the liquid crystal display panel 2 or from the sunlight is dispersed in the circulation flow passage 5. Thus, the increase in the temperature of the panel 2 and the circuit board 9 becomes gradual. Along with this, the temperature of the air in the circulation flow passage 5 becomes uniform and the increase in its temperature becomes gradual as well.

After executing step S3, the acquisition unit 92 reacquires the temperature T from the sensor 63 in step S4.

In step S5, the control unit 91 determines whether or not, the temperature T acquired in step S4 is equal to or lower than a second preset temperature T2. Here, T2 is lower than the first preset temperature T1 and is a temperature at which the air blowing fans 31, 32 should be deactivated.

An example where the temperature T measured by the air temperature sensor 63 decreases to T2 is a case where the temperature of outside air is low enough to cool the entire display device.

If the control unit 91 determines that the temperature T is equal to or lower than T2 (YES in step S5), the control unit 91 controls the air blowing fans 31, 32 to be turned OFF in step S6, and the circuit board 9 ends the control of the cooling device 4 and the air blowing fans 31, 32.

On the other hand, if the control unit 91 determines that the temperature T is neither equal to nor lower than T2 (NO in step S5), the control unit 91 determines in step S7 whether or not the temperature T acquired in step S4 is equal to or higher than a third preset temperature 13. Here, T3 is higher than the first preset temperature T1 and is a temperature at which the cooling device 4 should be activated in order to decrease the temperature inside the display device.

If the control unit 91 determines that the temperature T is neither equal to nor higher than T3 (NO in step S7), it returns to step S4, and the acquisition unit 92 reacquires temperature T from the air temperature sensor 63.

If the control unit 91 determines that the temperature T is equal to or higher than T3 (YES in step S7), the control unit 91 controls the cooling device 4 to be turned ON in step S8. At this time, the control unit 91 keeps the operation of the air blowing fans 31, 32 ON.

By operating both the air blowing fans 31, 32 and the cooling device 4, the air in the circulation flow passage 5 is cooled by the cooling device 4 and the cooled air is flown by the air blowing fans 31, 32 in the circulation flow passage 5. Thus, the liquid crystal display panel 2 and the circuit board 9 are cooled efficiently. Additionally, since the cooled air passes through the front surface side flow passage part 51, the cooled air can directly cool the image display screen 21 of the liquid crystal display panel 2. As a result, the increase in the temperatures of the liquid crystal display panel 2 and the circuit board 9 is inhibited, which reduces a trouble in the panel 2 and the circuit board 9.

At this time, a wall of the accommodation room 11 is cooled as well. In particular, since the glass plate 7 forming a part of the front surface wall 111 of the accommodation room 11 has a low specific heat compared to that of other materials that consists the wall, the temperature of the glass plate 7 is easily decreased by the cooled air.

After executing step S8, the acquisition unit 92 reacquires the temperature T measured by the air temperature sensor 63 from the sensor 63 in step S9.

In step S10, the control unit 91 determines whether or not the temperature T acquired in step S9 is equal to, or lower than a fourth preset temperature T4. Here, T4 is lower than T3 and higher than T2, and is a temperature at which the cooling device 4 should be deactivated in order for the temperature T not to be cooled excessively.

If the control unit 91 determines that the temperature T is neither equal to nor lower than T4 (NO in step S10), it returns to step S9, and the acquisition unit 92 reacquires the temperature T from the sensor 63.

If the control unit 91 determines that the temperature T is equal to or lower than T4 (YES in step S10), the control unit 91 controls the cooling device 4 and the air blowing fans 31, 32 to be turned OFF in step S11. In detail, the cooling device 4 is turned OFF simultaneously with or after the turn OFF of the air blowing fans 31, 32.

The control unit 91 starts measuring a time $\Delta t$ by using the counter 93 simultaneously with or immediately after the turn OFF of the cooling device 4 and the air blowing fans 31, 32.

By deactivating the cooling device 4, the temperatures of the liquid crystal display panel 2 and the circuit board 9 are prevented from excessive decreasing. As a result, trouble can be reduced in the panel 2 and the circuit board 9.

Though, by deactivating the cooling device 4, the air in the circulation flow passage 5 may be warmed by the heat generated from the panel 2, the circuit board 9, or the sun, by deactivating the air blowing fans 31, 32 as well as cooling device 4, the air flow is inhibited in the circulation flow passage 5. As a result, the warmed air hardly reaches the glass plate 7 which is cooled in step S8. Therefore, dew condensation occurring from a temperature difference between the glass plate 7 and the air can be prevented.

After deactivating both cooling device 4 and fans 31,32 in step S11, the control unit 91 controls the counter 93 to measure the time, and acquires the measured time $\Delta t$ as time information from the counter 93 in step S12.

In step S13, the control unit 91 determines whether or not the time $\Delta t$ acquired in step S12 is equal to or longer than a predetermined time $\Delta t0$. Here, $\Delta t0$ is around five minutes to ten minutes, for example.

If the control unit 91 determines that the time $\Delta t$ is neither equal to nor longer than $\Delta t0$ (NO in step S13), the control unit 91 reacquires the time $\Delta t$ from the counter 93 in step S12.

If the control unit 91 determines that the time $\Delta t$ is equal to or longer than $\Delta t0$ (YES in step S13), in other words, if time that has elapses after the deactivations of the cooling device 4 and the air blowing fans 31, 32 becomes $\Delta t0$, the control unit 91 controls the air blowing fans 31, 32 to be turned ON again in step S3.

When both the cooling device 4 and the air blowing fans 31, 32 are maintained in the deactivated state the temperature of the glass plate 7 increases. When the time elapsed since the deactivation becomes $\Delta t0$, the dew condensation hardly occurs on the glass plate 7, even if the warm air flows to the glass plate 7 due to the operations of the air blowing fans 31, 32. In other words, the predetermined temperature $\Delta t0$ is a temperature at which the dew condensation does not occur on the glass plate 7 even in the case where the air blowing fans 31, 32 are activated. As a result, the image display screen 21 is kept viewable from the front surface side of the casing 1.

After executing step S3, steps S4 and S5 are executed as described above, and steps S3 to S13 are repeatedly executed until the control unit 91 determines that the temperature T is equal to or lower than the second preset temperature T2 (YES in step S5).

According to the display device described above, not only it allows an outdoor installation, but also it inhibits the occurrence of the dew condensation inside the casing 1 having the waterproof structure.

According to the display device of this embodiment, although the sun light could enter the image display screen 21 of the liquid crystal display panel 2 through the glass plate 7 when the display device is installed outdoors, because a part of the front surface wall 111 of the accommodation room 11 is formed by the glass plate 7, since the front surface side flow passage part 51 is formed between the front surface wall 111 and the image display screen 21, the image display screen 21 can be cooled by the air flowing into the passage part 51 caused by the operations of the cooling device 4 and the air blowing fans 31, 32.

The cooled air may also cool the glass plate 7 by the operations of the cooling device 4 and the air blowing fans 31, 32. However, by deactivating the air blowing fans 31, 32 when deactivating the cooling device 4, it can reduce the dew condensation on the glass plate 7. Thus, the image display screen 21 is kept viewable from the front surface side of the casing 1.

2. Second Embodiment (The Structure of the Display Device)

Figure 5:
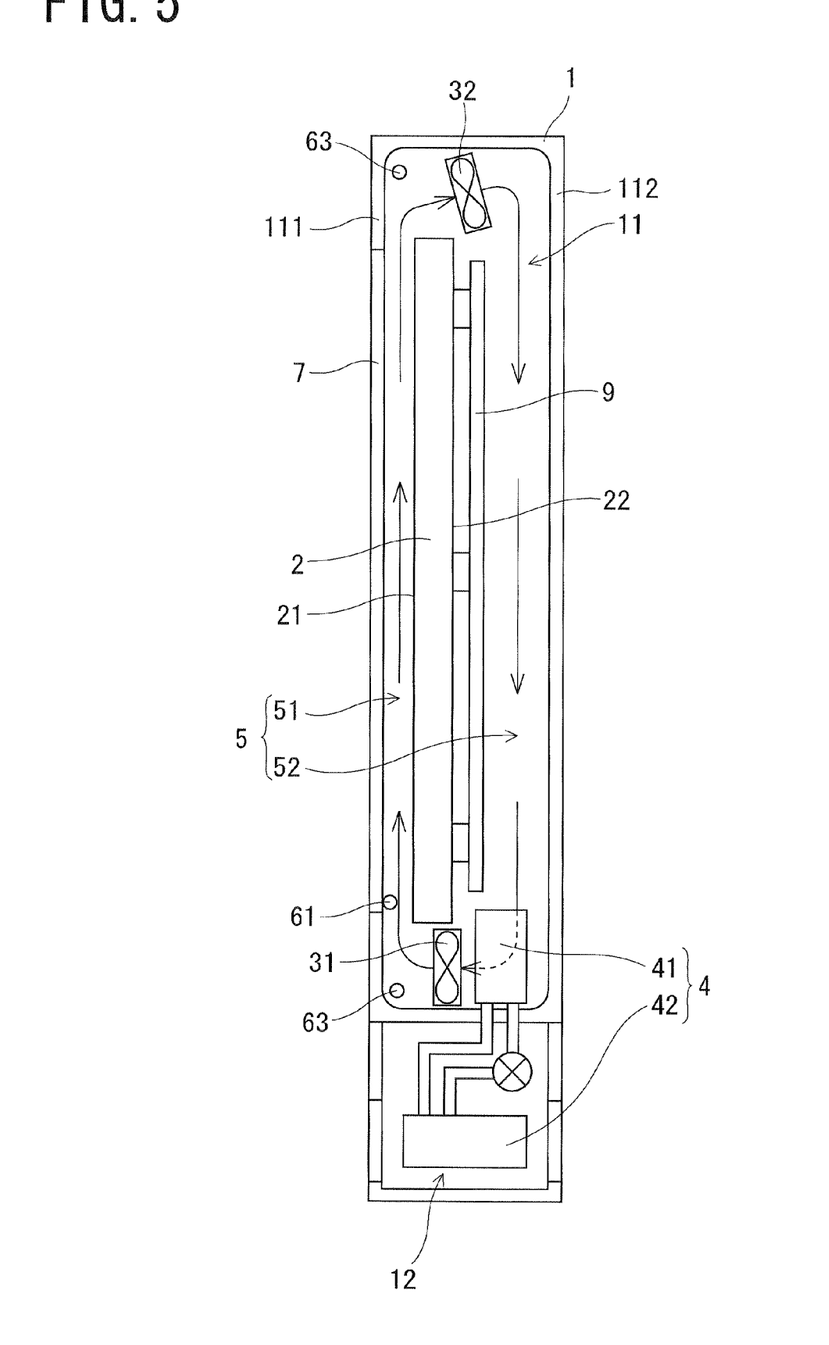
FIG. 5 is a vertical cross sectional view of a display device according to a second embodiment of the present invention.

As shown in FIG. 5, a display device according to a second embodiment further comprises a glass temperature sensor for measuring a temperature Ts1 of the glass plate 7 compared with the display device shown in FIG. 1. The sensor is arranged on a rear surface of the glass plate 7 where the air cooled by the cooling device 4 is blown.

The air cooled by the cooling device 4 flows from the rear surface side flow passage part 52 into the front surface side flow passage part 51 through the space below the liquid crystal display panel 2. Therefore, a rear surface of the glass plate 7 tends to be cooled in its lower area. In this embodiment, the glass temperature sensor 61 is arranged in this lower area, as shown in FIG. 5.

The number of glass temperature sensors 61 arranged on the glass plate 7 is not limited to one, and may be two or more.

(Controls Executed in Display Device)

Figure 6:
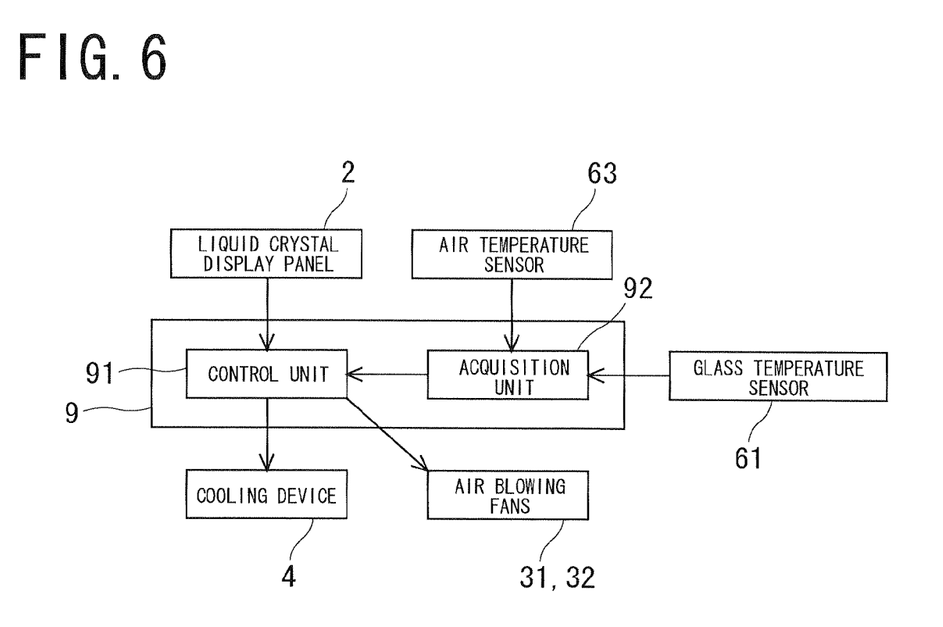
FIG. 6 is a block diagram showing a configuration of the display device according to the second embodiment of the present invention.

FIG. 6 is a block diagram showing a configuration of the display device described above. As shown in FIG. 6, the circuit board 9 comprises: the control unit 91 for controlling the liquid crystal display panel 2, the air blowing fans 31, 32, and the cooling device 4; and the acquisition unit 92 for acquiring the temperature information (the temperatures T, Ts1). The circuit board 9 controls the cooling device 4 and the air blowing fans 31, 32 in accordance with a flow chart shown in FIG. 7. In particular, the acquisition unit 92 acquires the temperature T measured by the air temperature sensor 63 and the temperature Ts1 measured by the glass temperature sensor 61.

Figure 7:
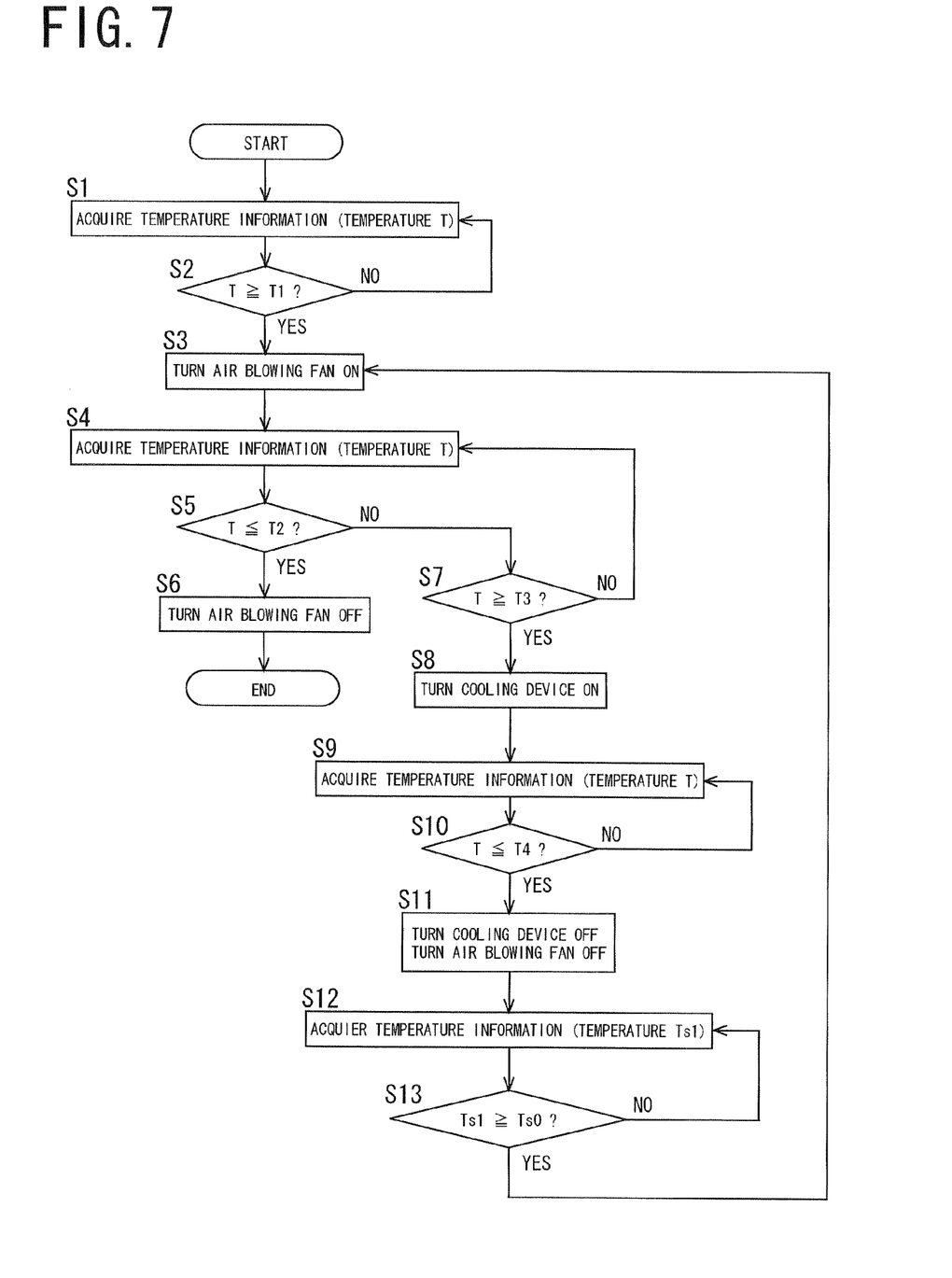
FIG. 7 is a flow chart showing a flow of control of the display device according to the second embodiment of the present invention.

The description of the control executed in steps S1 to S11 shown in FIG. 7 is omitted here since it is the same as the control executed in steps S1 to S11 shown in FIG. 4 described in the first embodiment.

Step S12 shown in FIG. 7 is executed after both the cooling device 4 and the air blowing fans 31, 32 are turned OFF by control unit 91 in step S11. In step S12, the acquisition unit 92 acquires the temperature Ts1 of the glass plate 7 measured by the glass temperature sensor 61.

In step S13, the control unit 91 determines whether or not the temperature Ts1 acquired in step S12 is equal to or higher than a predetermined temperature Ts0.

When the plurality of glass temperature sensors 61 are arranged, in step S12, the acquisition unit 92 acquires the temperature Ts1 measured by each of the sensors 61. In this case, by using an average value of these acquired temperatures Ts1, the determination by the control unit 91 can be executed in step S13.

If the control unit 91 determines that the temperature Ts1 is neither equal to nor higher than the predetermined temperature Ts0 (NO in step S13), it returns to step S12, and the acquisition unit 92 reacquires the temperature Ts1.

If the control unit 91 determines that the temperature Ts1 is equal to or higher than Ts0 (YES in step S13), it returns to step S3, and the control unit 91 turns the air blowing fans 31, 32 to be ON.

As described above, by executing steps S12 and S13, both the cooling device 4 and the air blowing fans 31, 32 are kept deactivated until the temperature Ts1 of the glass plate 7 rises to the predetermined temperature Ts0.

When the temperature Ts1 of the glass plate 7 rises to Ts0, the dew condensation hardly occurs on the glass plate 7 even in if a warm air comes into contact with the glass plate due to the operation of the air blowing fans 31, 32. In other words Ts0 is a temperature of the glass plate 7 at which the dew condensation does not occur on the glass plate 7 even in the case where the air blowing fans 31, 32 operate with the cooling device 4 being in the deactivated state. As a result, the image display screen 21 is kept viewable from the front surface side of the casing 1.

According to this embodiment, since both the cooling device 4 and the air blowing fans 31, 32 are in the deactivated state until the temperature of the glass plate 7 reaches the predetermined temperature Ts0, the image display screen 21 can be kept viewable from the front surface side of the casing 1 further, compared with the first embodiment.

(Modification)

Figure 8:
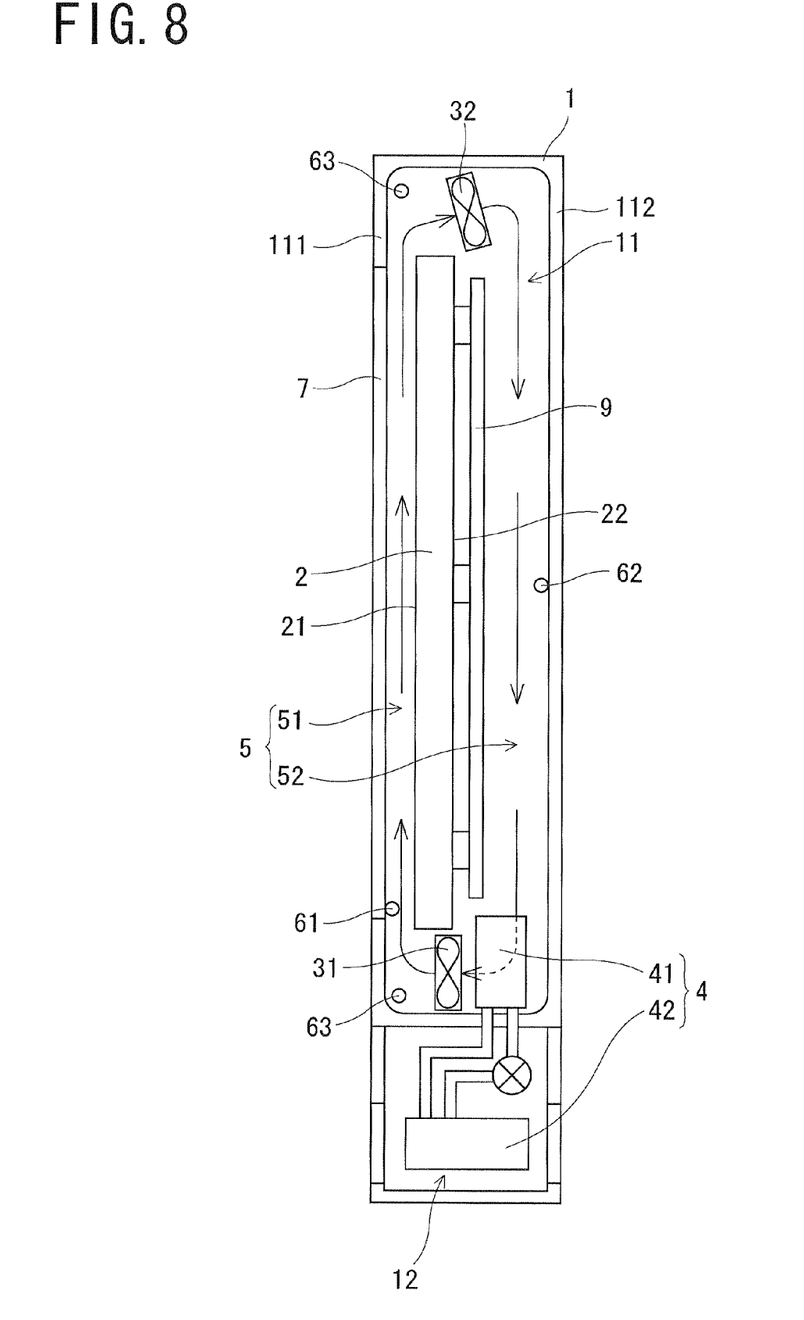
FIG. 8 is a vertical cross sectional view of a modification of the display device according to the second embodiment of the present invention.

As shown in FIG. 8, the display device according to this modification further comprises a second air temperature sensor for measuring a temperature Ts2 of the air in the rear surface side flow passage part 52 compared to the display device shown in FIG. 5. The sensor 62 is arranged on a front surface of a rear surface wall 112 of the accommodation room 11.

The number of the sensors 62 arranged may be one or more.

Figure 9:
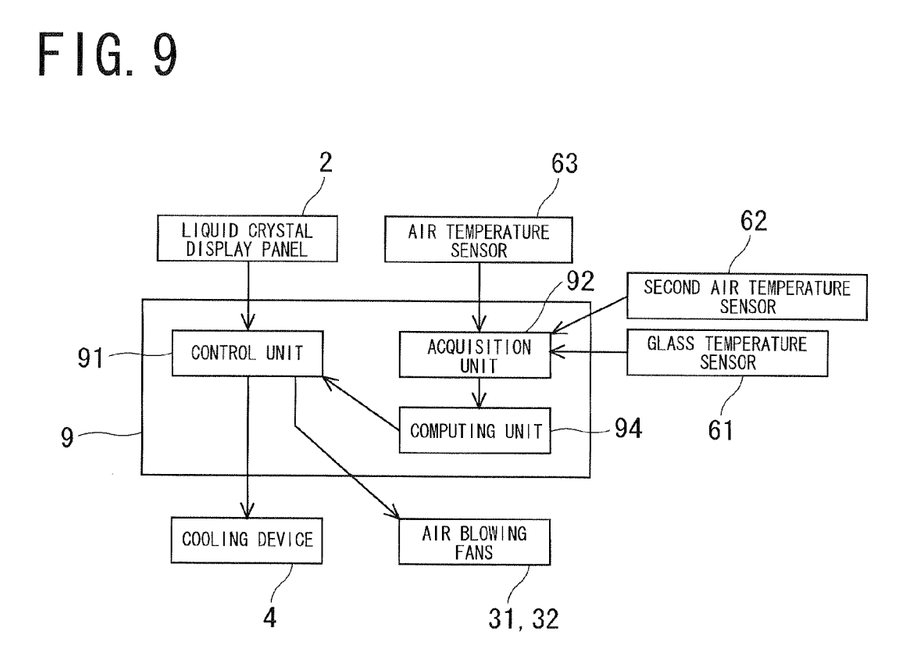
FIG. 9 is a block diagram showing a configuration of the modification of the display device.

FIG. 9 is a block diagram showing a configuration of the display device of this modification. As shown in FIG. 9, the circuit board 9 comprises: the control unit 91 for controlling the liquid crystal display panel 2, the air blowing fans 31, 32, and the cooling device 4; the acquisition unit 92 for acquiring the temperature information (temperatures T, Ts1, and Ts2); and a computing unit 94 computing based on the temperature information. The circuit board 9 controls the cooling device 4 and the air blowing fans 31, 32 in accordance with a flow chart shown in FIG. 10.

The acquisition unit 92 acquires the temperature T measured by the air temperature sensor 63, the temperature Ts1 measured by the glass temperature sensor 61, and the temperature Ts2 measured by the second air temperature sensor 62. The computing unit 94 calculates a difference between the temperature Ts1 and the temperature Ts2.

Figure 10:
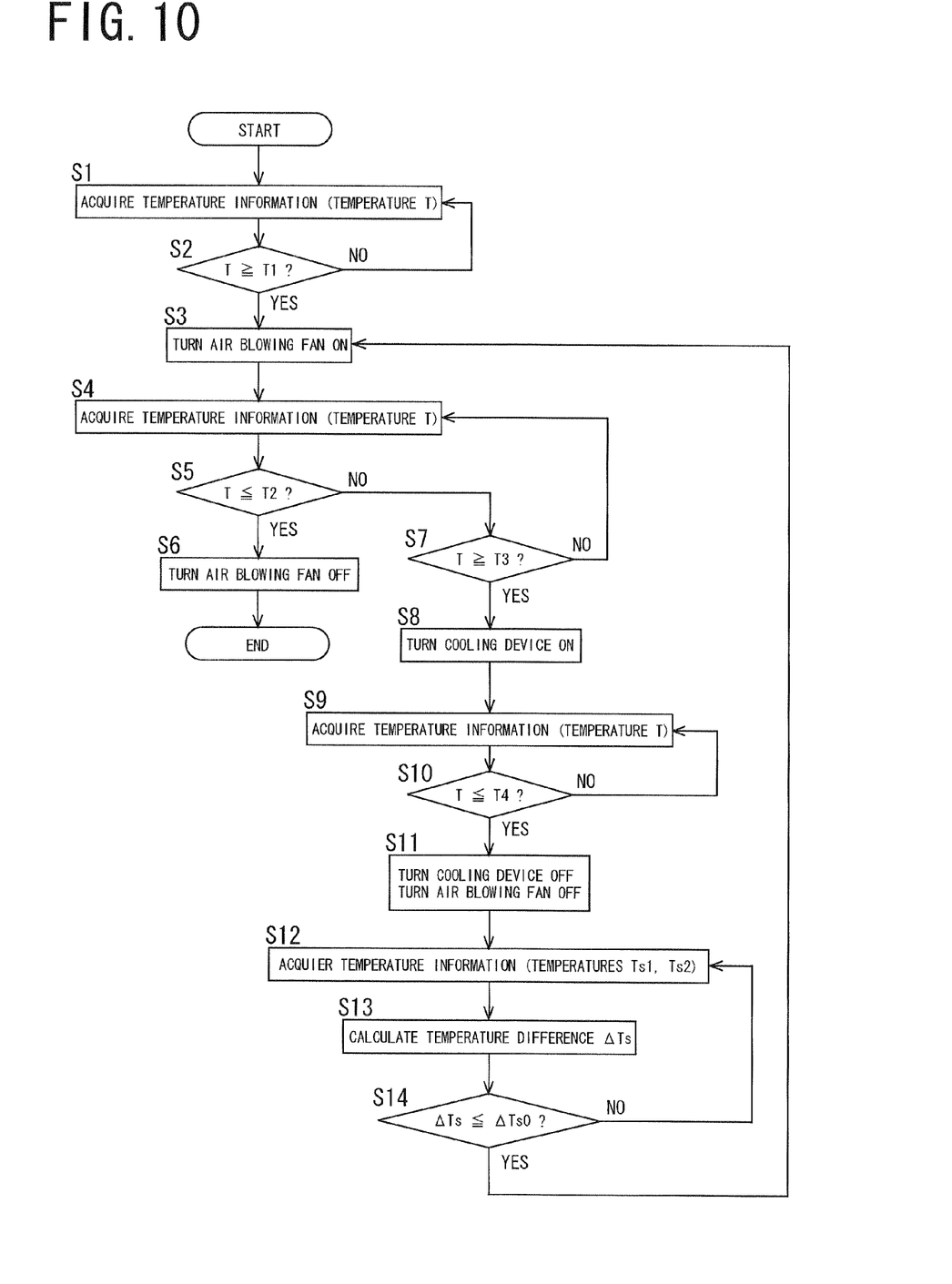
FIG. 10 is a flow chart showing a flow of control of the modification of the display device.

The description of the control executed in steps S1 to S11 shown in FIG. 10 is omitted here since it is the same as the control executed in steps S1 to S11 shown in FIG. 4 described in the first embodiment.

Step S12 shown in FIG. 10 is executed after the control unit 91 turns off the cooling device 4 and the air blowing fans 31, 32 in step S11. In step S12, the acquisition unit 92 acquires the temperatures Ts1 and Ts2 from the sensors 61 and 62.

Then in step S13, the computing unit 94 calculates a temperature difference $\Delta Ts$ between the glass plate 7 and the air in the rear surface side flow passage part 52 using Ts1 and Ts2 acquired in step S12.

When the plurality of air temperature sensors 62 are arranged, the acquisition unit 92 acquires the temperature Ts2 measured by these sensors 62. In this case, an average value of measured temperatures Ts2 may be used for the computation by the computing unit 94 in step S13.

In step S14, the control unit 91 determines whether or not $\Delta Ts$ calculated in step S13 is equal to or less than a predetermined temperature difference $\Delta Ts0$. Here, $\Delta Ts0$ is a minimum temperature difference between the glass plate 7 and the air in the rear surface side flow passage part 52, with which the dew condensation does not occur on the glass plate 7 even in the case where the air blowing fans 31, 32 operate with the cooling device 4 being in the deactivated state.

If the control unit 91 determines that the temperature difference $\Delta Ts$ is neither equal to nor less than $\Delta Ts0$ (NO in step S14, it returns to step S12, and the acquisition unit 92 reacquires the temperatures Ts1, Ts2 from the sensors 61 and 62. Then, the computing unit 94 calculates the temperature difference $\Delta Ts$ in step S13.

If the control unit 91 determines that the temperature difference $\Delta Ts$ is equal to or less than $\Delta Ts0$ (YES in step S14), it returns to step S3, and the control unit 91 turns the air blowing fans 31, 32 ON again.

According to this modification, since a reactivation of the air blowing fans 31, 32 is performed based on the temperature difference $\Delta Ts$ between the temperature of an easily cooled part of the glass plate 7 and the temperature of an easily warmed part (rear surface side flow passage part 52, which is easily warmed by the heat of the liquid crystal display panel 2 or the circuit board 9), the dew condensation on the glass plate 7 can be further reduced.

In the modification described above, the control unit 91 controls the air blowing fans 31, 32 based on the difference between the temperatures measured by the glass temperature sensor 61 and the second air temperature sensor 62. However, the control unit 91 may control these fans based on the difference between the temperatures measured by the air temperature sensor 63 and the second air temperature sensor 62.

The present invention is not limited to the foregoing embodiments in construction but can be modified variously within the technical range set forth in the appended claims. For example, although a part of the front surface wall 111 of the accommodation room 11 is formed by the glass plate 7 in the embodiment described above, it may be formed by a light transmission plate.

In the embodiment described above, although the air flows from bottom up in the front surface side flow passage part 51, and the air flow from top down in the rear surface side flow passage part 52 due to the operations of the air blowing fans 31, 32, these fans may be operated so that the air flow from top down in the passage part 51, and the air flow from bottom up in the passage part 52. In such a case, the air cooled by the cooling device 4 flows from the passage part 52 into the front passage part 51 via the space above the liquid crystal display panel 2, and the rear surface of the glass plate 7 tends to be cooled in its upper area. In this case, the glass temperature sensor 61 may be arranged in this upper area.

In the embodiment described above, the control unit 91 controls the air blowing fans 31, 32 and the cooling device 4 based on the temperatures measured by the sensors 61, 62, and 63 which are provided inside the display device. The control unit 91 may control them based on the temperature measured by the sensors arranged outside of the display device. In other words, display device may have a data acquisition unit which acquires temperature data measured by the sensors arranged outside of the display device. In this case, the data acquisition unit functions as a temperature detecting unit provided to the display device.

The present invention can be applied to a display device which does not have the accommodation room 11 in the casing 1. For example, if the display device is such that the air in the casing 1 can pass the front surface side and the rear surface side of the liquid crystal display panel 2 to circulate, the accommodation room 11 may be omitted in the casing 1.

Further, the present invention can be applied to not only the display device comprising the liquid crystal display panel 2, but also a display device comprising a display panel such as a plasma display panel, or an organic EL (Electro-Luminescence) display panel.

What is claimed is:

1. A display device comprising:
    a display panel;
    a cooling unit cooling air in a casing containing the display panel;
    a fan unit generating an air flow in the casing; and
    a control unit controlling the cooling unit and the fan unit, wherein
    when the control unit deactivates the cooling unit, the control unit also deactivates the fan unit, and
    wherein the control unit activates the fan unit while keeping the cooling unit deactivated, when a predetermined time has elapsed from the deactivation of the cooling unit and the fan unit.

2. The display device according to claim 1, further comprising:
    a circulation flow passage inside the casing, surrounding the display panel, wherein
    the control unit operates the cooling unit to cool the air in the circulation flow passage, and operates the fan unit to circulate the air in the circulation flow passage.

3. The display device according to claim 1, further comprising:
    a detecting unit detecting temperature, wherein
    the control unit activates the fan unit while keeping the cooling unit deactivated based on the temperature detected by the detecting unit after the deactivation of the fan unit.

4. The display device according to claim 3, further comprising:
    a circulation flow passage in the casing, circulating around the display panel, wherein
    the detecting unit comprises a first detecting part and a second detecting part arranged on the front surface side and the rear surface side of the display panel respectively,
    the control unit activates the fan unit while keeping the cooling unit deactivated based on a difference between the temperature detected by the first detecting part and the temperature detected by the second detecting part, after the deactivation of the cooling unit and the fan unit.

* * * * *